United States Patent [19]
Sato

[11] Patent Number: 5,506,165
[45] Date of Patent: Apr. 9, 1996

[54] METHOD OF MANUFACTURING LIQUID-CRYSTAL DISPLAY PANEL

[75] Inventor: Toshihiro Sato, Mobara, Japan

[73] Assignee: Hitachi, Ltd., Tokyo, Japan

[21] Appl. No.: 404,462

[22] Filed: Mar. 15, 1995

[30] Foreign Application Priority Data

Mar. 16, 1994 [JP] Japan .................. 6-045596

[51] Int. Cl.⁶ .................. H01L 21/70
[52] U.S. Cl. .................. 437/57; 437/34; 437/51; 437/181
[58] Field of Search .................. 437/57, 59, 51, 437/40, 41, 34, 48, 181

[56] References Cited

U.S. PATENT DOCUMENTS

| | | | |
|---|---|---|---|
| 5,032,531 | 7/1991 | Tsutsui et al. | 437/40 |
| 5,256,562 | 10/1993 | Vu et al. | 437/86 |
| 5,320,973 | 6/1994 | Kobayashi | 437/181 |
| 5,405,490 | 4/1995 | Park et al. | 437/181 |

*Primary Examiner*—Tuan H. Nguyen
*Attorney, Agent, or Firm*—Antonelli, Terry, Stout & Kraus

[57] ABSTRACT

To prevent occurrence of a breakdown in the drains of thin-film transistors formed in a display area, without an increase in the number of manufacturing steps required for a conventional manufacturing method. When the source and drain regions of each MOS transistor in a display area are formed by impurity implantation using its gate electrode as a mask, the side walls of the gate electrode across the channel are covered with a mask provided together with the mask for covering the MOS transistors of one type of the complementary MOS transistors in an area outside the display area.

14 Claims, 10 Drawing Sheets

Vth=1.5V
Ion/Ioff=10$^6$
μeff=20cm$^2$/V·s

FIG. 9 (b)

Vth=3.0V
Ion/Ioff=10$^5$
μeff=15cm$^2$/V·s

METHOD OF MANUFACTURING LIQUID-CRYSTAL DISPLAY PANEL

BACKGROUND OF THE INVENTION

The present invention relates to a method of manufacturing a liquid-crystal display panel, and, more particularly, to a method of manufacturing a so-called active matrix liquid-crystal display panel provided with thin film switching elements which correspond to individual pixels.

The aforesaid liquid-crystal display panel provided with thin film switching elements operates in such a manner that all thin film switching elements corresponding to individual pixels arrayed in a predetermined column of a matrix of pixels are turned on, and voltages corresponding to a video signal are applied to the individual pixels via the thin film switching elements which are turned on.

The thin film switching element consists of an MOS transistor which is obtained by forming an insulator film to cover a semiconductor layer made of, for example, polycrystalline silicon (referred to as poly-Si) formed on a surface of a transparent plate in the shape of islands; forming gate electrodes on the insulator film in such a manner as to divide the semiconductor layer into parts; and forming source regions and drain regions by impurity ion implantation by using the gate electrodes as a mask (self alignment).

In this arrangement, the gate electrodes of the thin film switching elements arrayed in the columns are connected in common to constitute scanning lines, whereas the drain electrodes of the thin film switching elements arrayed in the rows are connected in common to constitute video signal lines.

The source and drain regions in the liquid-crystal display panel described above are formed by impurity ion implantation using the gate electrodes as a mask. As a result, the source and drain regions are formed in such a manner that their opposing ends are positioned immediately under the corresponding sides of the gate electrode in the channel-width direction thereof.

For this reason, if a thin film switching element is turned off, the charge stored in a corresponding pixel electrode will cause an avalanche phenomenon on the drain side of a gate electrode via the gate electrode which has a negative potential with respect to the potential of a source (drain-induced breakdown).

One approach to this problem is to offset the source and drain regions from each gate electrode. However, this approach still has the problem of increasing the number of manufacturing steps.

SUMMARY OF THE INVENTION

The present invention has been made in light of the above-described problem, and its object is to provide a method of manufacturing a liquid-crystal display panel capable of preventing occurrence of a breakdown in the drain of an MOS transistor formed in a display area, without an increase in the number of manufacturing steps.

To achieve the above object, the present invention provides a manufacturing method for a liquid-crystal display panel comprising liquid crystal between two opposed transparent plates, one of which includes a display area containing MOS transistors (called thin film transistors in this specification, which are formed in only the display area) corresponding to individual pixels and an outside area (an area outside the display area) containing a circuit of complementary MOS transistors. This method comprises the step of implanting impurity into the display area masked by the gate electrodes of the MOS transistors to form their source and drain regions in the display area. The impurity is implanted in such a manner that the edges (side walls) of the gate electrodes, across the channel (in a channel-width direction), are covered with a mask formed together with (e.g., simultaneously with) the mask used to form the transistors of one type of the complementary MOS transistors in the outside area.

According to the above-described method of manufacturing the liquid-crystal display panel, the mask is formed to cover the edges (side walls) of the gate electrode across the channel before the impurity implantation is performed. Accordingly, the source and drain regions formed by this impurity implantation constitute an offset structure with respect to the gate electrode. This offset structure makes it possible to prevent occurrence of a breakdown in the drain of a thin film transistor.

In addition, the aforesaid mask includes a mask for use to form MOS transistors of one type (different in conductivity type from that of the thin film transistors) of the complementary MOS transistors formed in the outside area. Accordingly, there is no need to increase the number of manufacturing steps.

DESCRIPTION OF THE PREFERRED EMBODIMENTS

One embodiment of a liquid-crystal display panel according to the present invention will be described below with reference to FIGS. 6(a), 6(b), 7(a), 7(b), 8(a) and 8(b).

Figure 6:
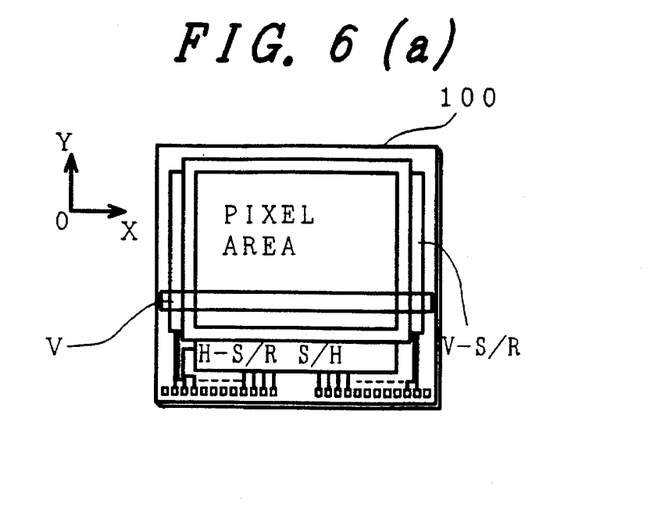
FIGS. 6(a) and 6(b) are views showing a circuit formed outside a display area of a liquid-crystal display panel to which the present invention is applied.

FIG. 6(a) shows a plan view of a liquid-crystal display panel 100. The liquid-crystal display panel 100 has a display area (pixel area) in its central portion excluding its peripheral portion (the peripheral portion forming the outside area). This display area includes an upper glass plate, a lower glass plate, and liquid crystal between the opposed upper and lower glass plates, in such a manner as to constitute a matrix of pixels.

Vertical scanning circuits V are respectively formed on the lower glass plate along the right and left sides of the display area as viewed in FIG. 6(a).

As shown in FIG. 6(b), the vertical scanning circuits V comprise a number of inverter circuits, which are formed of complementary MOS transistors (not shown).

The outputs of the vertical scanning circuits V are transmitted to the display area via gate signal lines GL, respectively. These gate signal lines GL are extended in the row (X) direction and arranged in parallel in the column (Y) direction on the lower glass plate within the display area.

A video signal driving circuit H is formed on the lower glass plate along the lower side of the display area as viewed in FIG. 6(a).

Figure 7A:
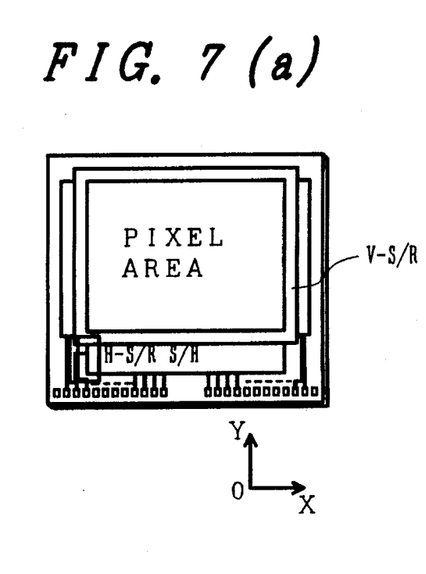
FIGS. 7(a) and 7(b) are views showing a circuit formed outside the display area of the liquid-crystal display panel to which the present invention is applied.
Figure 7B:
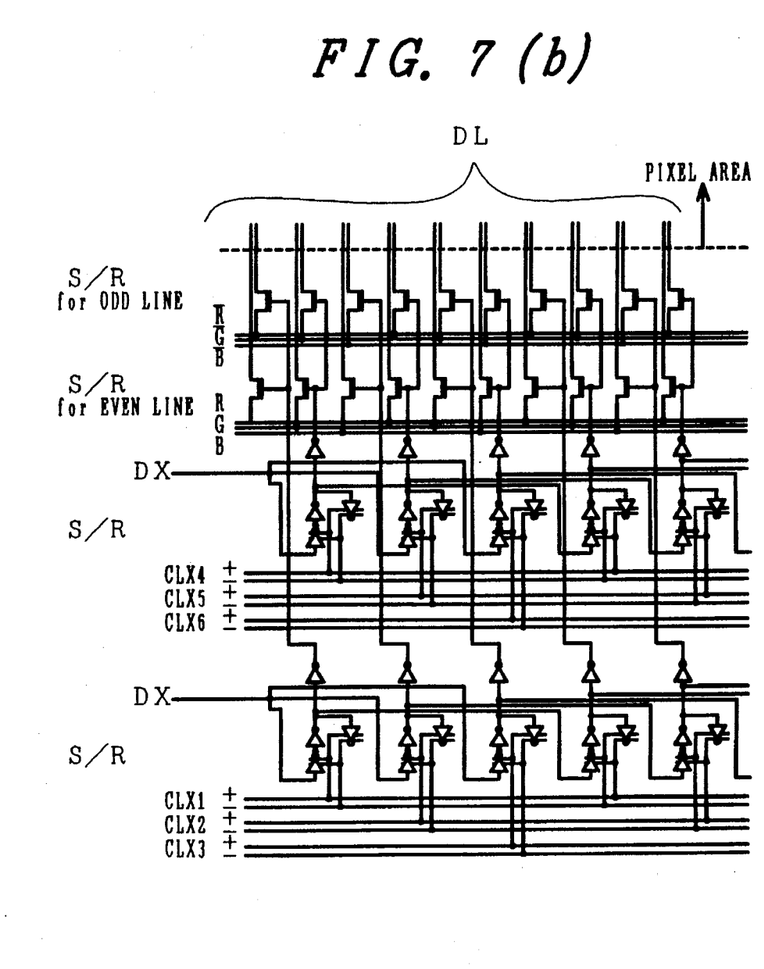

This video signal driving circuit H is formed of a number of inverter circuits as shown in FIG. 7(a) and FIG. 7(b). Although not shown, the inverter circuits are made of complementary MOS transistors. The liquid-crystal display panel in FIG. 7(a) is the same as that shown in FIG. 6(a).

The outputs of the video signal driving circuit H are respectively transmitted to the display area via drain signal lines DL. These drain signal lines DL are extended in the (Y) direction and arranged in parallel in the row (X) direction on the lower glass plate within the display area.

Figure 8A:
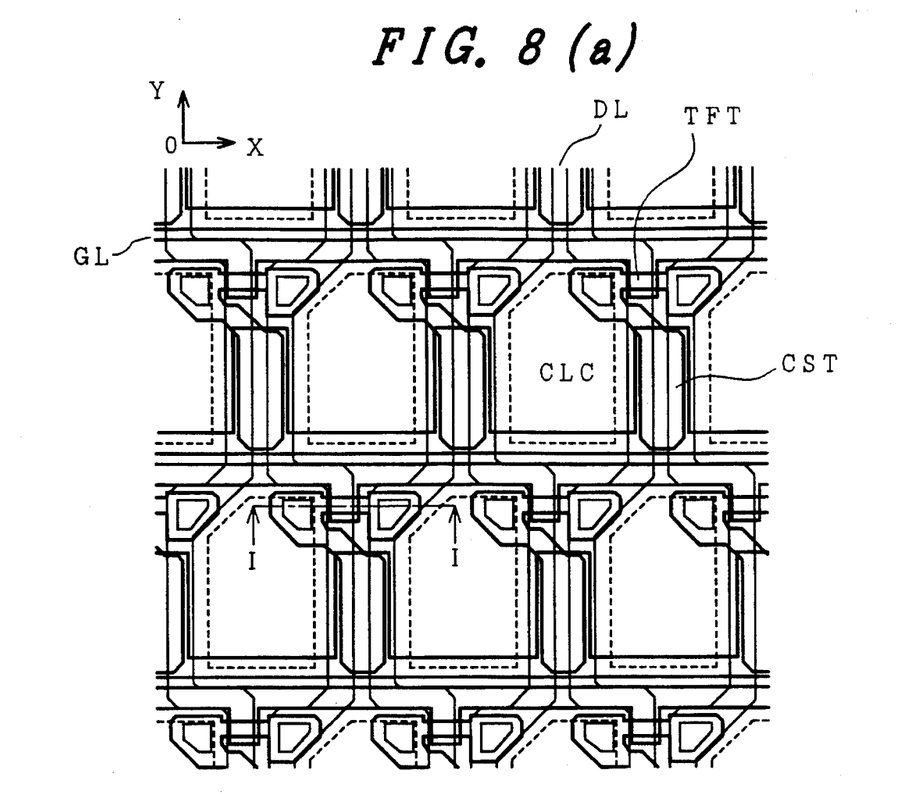
FIGS. 8(a) and 8(b) are views showing a circuit formed within the display area of the liquid-crystal display panel to which the present invention is applied.

FIG. 8(a) shows part of the internal arrangement of the display area. The other portion of the display area is also arranged in a similar pattern.

As shown in FIG. 8(a), the gate signal lines GL and the drain signal lines DL intersect at right angles, thereby defining pixel areas. In each pixel area, a pixel electrode CLC made, for example, indium-tin-oxide (referred to as ITO) is formed. A thin-film transistor TFT is formed in the vicinity of each pixel electrode CLC, and the pixel electrode CLC is connected to one of the drain signal lines DL via the thin-film transistor TFT.

The gate electrode of the thin film transistor TFT is formed by using part of the gate signal line GL.

In this arrangement, if a signal is inputted to one of the gate signal lines GL, the thin film transistor TFT is turned on and a voltage corresponding to a video signal is applied to the pixel electrode CLC via the thin film transistor TFT from the corresponding drain signal lines DL. An electric field is produced across the liquid crystal between the pixel electrode CLC and a common electrode (not shown) which is formed on the upper glass plate. This electric field varies the transmissivity of the liquid crystal.

The pixel electrode CLC is connected to a storage capacitance element CST which is formed in its vicinity. This storage capacitance element CST serves to store a video signal for a long time, for example, after the thin film transistor TFT is turned off.

Figure 8B:
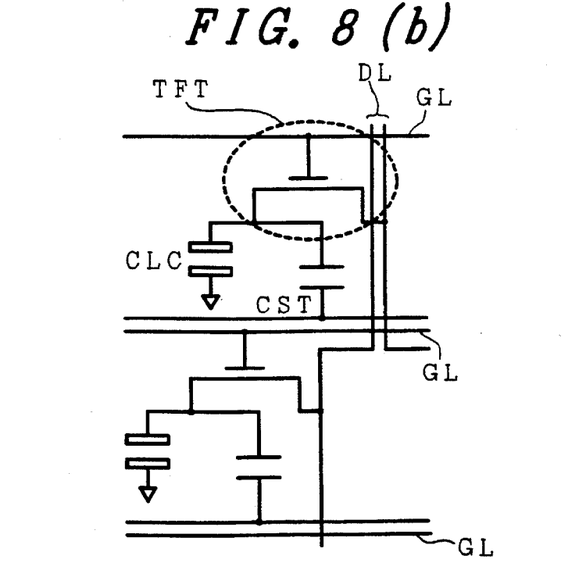

In the embodiment shown in FIG. 8(a) and FIG. 8(b), the storage capacitance element CST is connected to a capacitance line via its electrode which is not connected to the pixel electrode CLC, and a voltage equal to that applied to the common electrode is applied to the storage capacitance element CST.

FIG. 8(b) shows an equivalent circuit of that shown in FIG. 8(a).

One example of a method of manufacturing the liquid-crystal display panel having the above-described arrangement will be described below step-by-step with reference to FIGS. 1(a) through 4(d). This method is exemplary of the present invention, and is not limiting. In each of FIGS. 1(a) through 4(d), the left-side portion represents an area inside of the display area in which to form the thin film transistor TFT, while the right-side portion represents an area outside of the display area in which to form the complementary MOS transistors. A method of manufacturing the thin film transistor TFT will be described later with reference to a cross-sectional view taken along line I—I of FIG. 8(a).

Figure 1A:
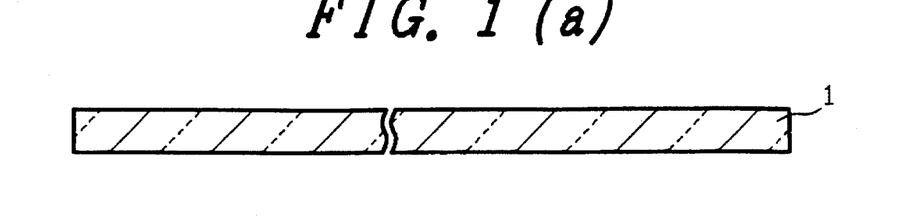
FIGS. 1(a) through 1(e) are first views showing an embodiment of a method of manufacturing a liquid-crystal display panel according to the present invention.

Step 1 (FIG. 1(a))

A glass plate having a fully cleaned, main surface is prepared.

Figure 1B:
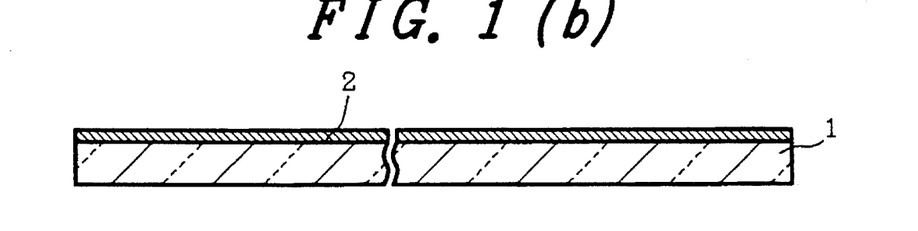

Step 2 (FIG. 1(b))

A poly-Si layer 2 is formed over the main surface of the glass plate by a deposition process.

Figure 1C:
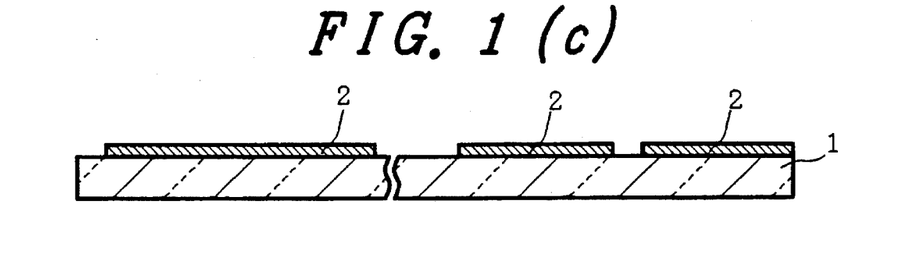

Step 3 (FIG. 1(c))

The poly-Si layer 2 is selectively etched. This etching is conducted so that the poly-Si layer 2 can remain selectively in the area inside of the display area in which to form thin film transistors TFT and storage capacitance elements CST as well as in the area outside the display area in which to form switching elements (particularly, complementary MOS transistors).

Figure 1D:
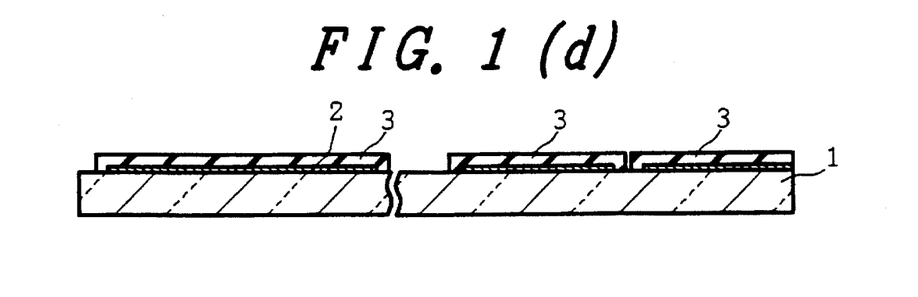

Step 4 (FIG. 1(d))

The surface of the remaining poly-Si layer 2 is subjected to thermal oxidation to form a silicon oxide film 3. This silicon oxide film 3 constitutes a gate oxide film for a thin film transistor TFT or the like which is to be formed later.

Figure 1E:
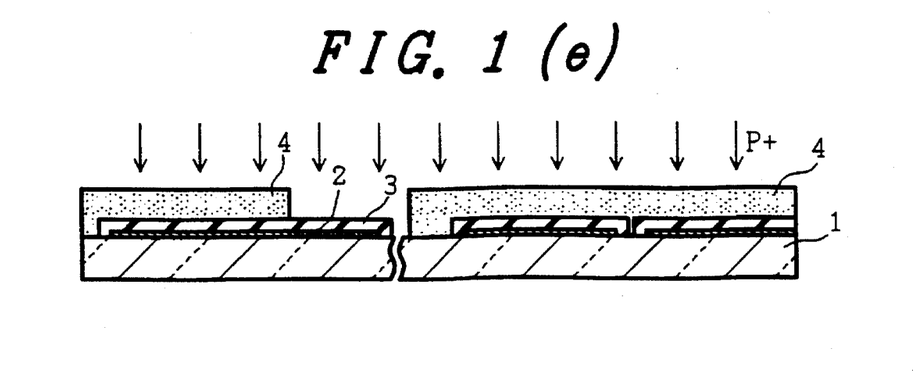

Step 5 (FIG. 1(e))

A photoresist film 4 is applied to the entire area of the main surface processed in the above-described manner. The photoresist film 4 is selectively removed to expose an area in which to form a storage capacitance element CST.

After that, the polysilicon layer 2 for the storage capacitance element CST is heavily doped with p-type impurity by ion implantation so that it may become conductive. This conductive poly-Si layer 2 constitutes one electrode of the storage capacitance element CST which is to be formed later.

Figure 2A:
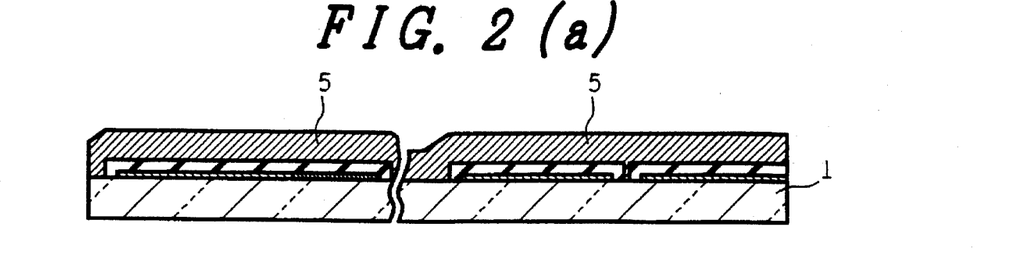
FIGS. 2(a) through 2(d) are second views showing this embodiment of the method of manufacturing the liquid-crystal display panel according to the present invention.

Step 6 (FIG. 2(a))

The remaining photoresist film 4 is removed, and a poly-Si layer 5 treated with phosphorous (P) is formed over the entire area of the glass plate by a deposition process.

Figure 2B:
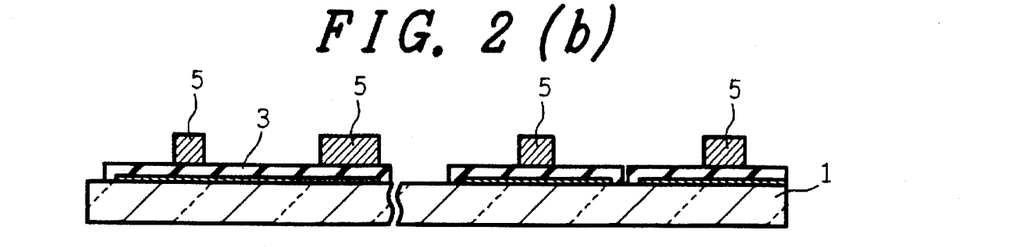

Step 7 (FIG. 2(b))

The poly-Si layer 5 is selectively etched, thereby forming the gate electrodes of the thin film transistors TFT and those of complementary MOS transistors as well as the storage capacitance elements CST.

Figure 2C:
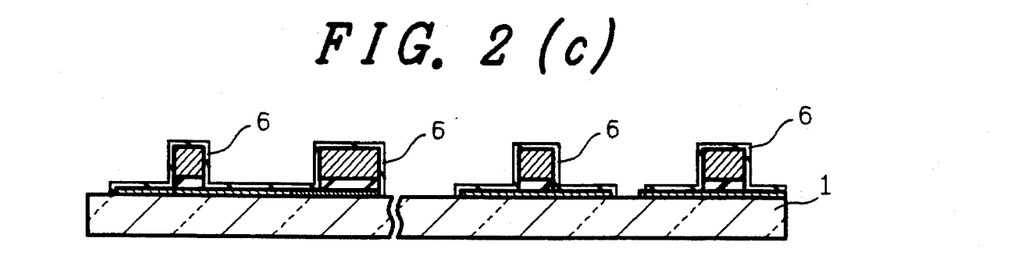

Step 8 (FIG. 2(c))

The portion of the silicon oxide film 3 which is exposed from the remaining poly-Si layer 5 is etched by using the poly-Si layer 5 as a mask.

The poly-Si layer 2 exposed by the etching of the silicon oxide film 3, and the poly-Si layer 5 formed as the gate electrodes and the like, are subjected lightly to thermal oxidation, thereby forming a silicon oxide film 6 on the poly-Si layers 2 and 5.

Step 9 (FIG. 2 (d))

Figure 2D:
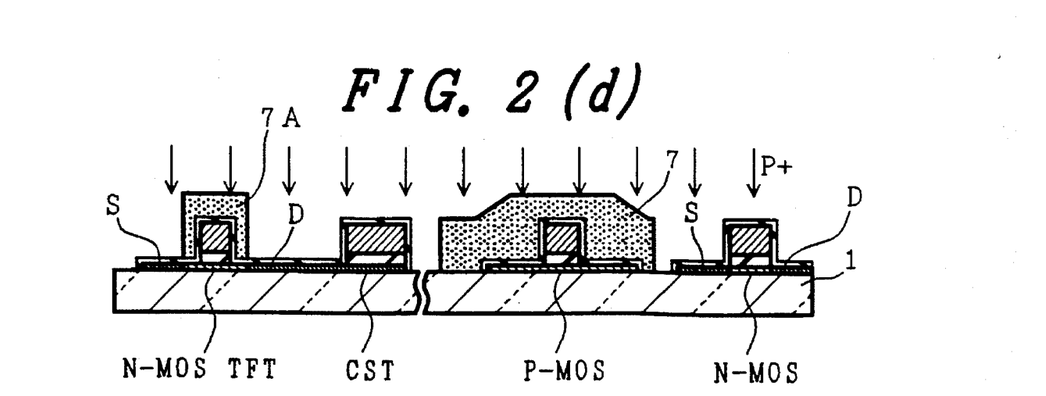
Figure 3:
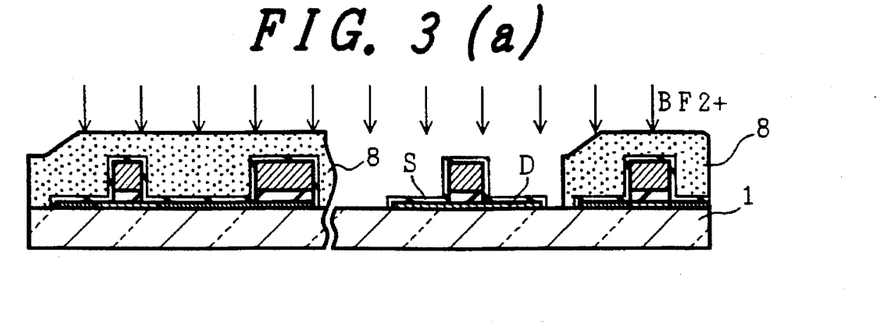
FIGS. 3(a) through 3(d) are third views showing this embodiment of the method of manufacturing the liquid-crystal display panel according to the present invention.
Figure 4:
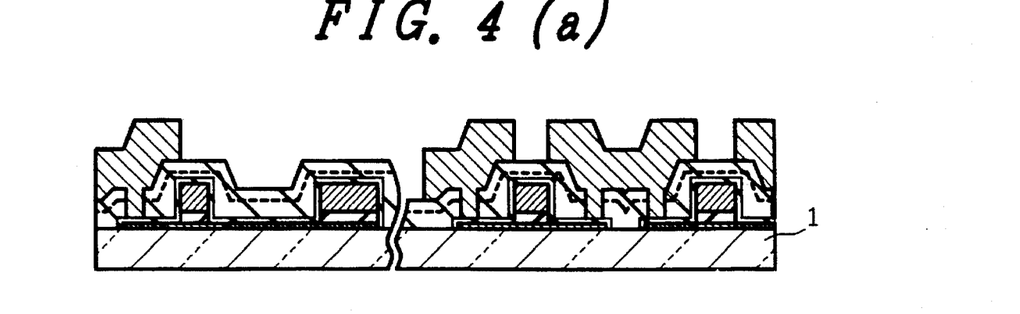
FIGS. 4(a) through 4(d) are fourth views showing this embodiment of the method of manufacturing the liquid-crystal display panel according to the present invention.

A photoresist 7 is formed to cover the entire area of p-type MOS transistors of the complementary MOS transistors. The p-type MOS transistors have a conductivity type different from that of the thin film transistors TFT.

In this example, particularly in Step 9, a photoresist 7A is formed (simultaneously with photoresist 7 to cover the entire area of p-type MOS transistors of the complementary MOS transistors) to cover the gate electrode of the thin-film transistors TFT.

More specifically, the photoresist 7 is formed over the entire area of the glass plate and is then selectively removed in such a manner as to leave the photoresist formed on the top of the p-type MOS transistors of the complementary MOS transistors and the photoresist (indicated by reference numeral 7A) formed on the top of the gate electrode of the thin film transistors TFT and on side walls of the gate electrode of the thin film transistors TFT.

In this case, it is essential that the photoresist 7A which remains on the thin film transistor TFT be formed to cover at least the opposite side walls of the gate electrode in the channel-width direction thereof.

After that, the entire area of the surface processed in the above-described manner is heavily doped with p-type impurity by ion implantation.

In this manner, the source region S and drain region D of the thin film transistor TFT are formed together with (e.g., simultaneously with) the source region S and drain region D of the n-type MOS transistor of the complementary MOS transistors.

Figure 5:
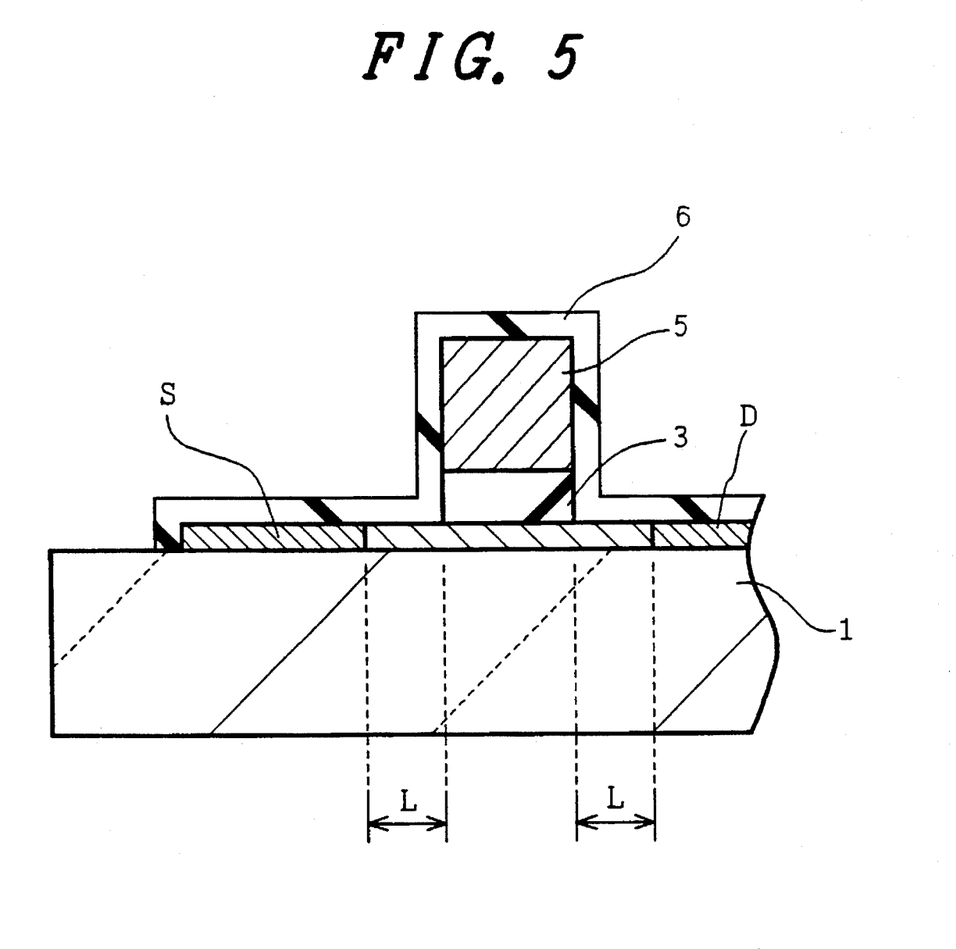
FIG. 5 is an explanatory view showing in detail this method of manufacturing the liquid-crystal display panel according to the present invention.

The source region S and the drain region D of the thin film transistor TFT are positioned in such a manner that their opposing ends are a distance L outside the edges (side walls) of the gate electrode, as shown in FIG. 5 in more detail. Illustratively, L is at least 1.5 μm.

In this manner, the source region S and the drain region D are offset from the gate electrode (indicated by reference numeral 5).

Step 10 (FIG. 3(a))

The remaining photoresist 7 (including photoresist 7A) is removed, and a new photoresist 8 is formed over the entire area of the glass plate and is then selectively removed. Only the p-type MOS transistor of the complementary MOS transistors is exposed by this selective removal.

After that, a p-type impurity consisting of boron fluoride ($BF_2$) is introduced by ion implantation, thereby forming the source region S and the drain region D of the p-type MOS transistors.

Step 11 (FIG. 3(b))

The remaining photoresist 8 is removed and a silicon oxide film and a phosphosilicate glass are sequentially formed, as by vapor phase growth, thereby forming an insulator film 9 having a two-layer structure.

Step 12 (FIG. 3(c))

The insulator film 9 is selectively etched. This selective etching is performed to form contact holes CH through which to expose part of the drain region D of the thin film transistor TFT and part of the source and drain regions S and D of the p- and n-type MOS transistors of the complementary MOS transistors.

Step 13 (FIG. 3(d))

An aluminum film 10 is formed over the entire area of the insulator film 9 including the portions in which the respective contact holes CH are formed.

Step 14 (FIG. 4(a))

The aluminum film 10 is selectively etched. A wiring layer having connection portions at the respective contact holes CH is formed by this selective etching.

Step 15 (FIG. 4(b))

An insulator film 11 made from a silicon oxide film is formed over the entire area of the surface on which the wiring layer is formed in this manner.

After that, the insulator film 11 is removed by selective etching from an area portion which corresponds to a pixel area as well as its periphery.

Step 16 (FIG. 4(c))

The portion of the overlying insulator film 9 that corresponds to the pixel area is selectively etched to expose the poly-Si layer 2 which underlies the insulator film 9.

Step 17 (FIG. 4(d))

A transparent conductive film made of ITO is formed over the entire area of the surface processed in this manner, and this transparent conductive film is selectively etched so that it can remain over the pixel area and the periphery. The obtained transparent conductive film serves as a pixel electrode 12.

According to the above-described example of the method of manufacturing the liquid-crystal display panel, a mask, indicated by reference number 7A in FIG. 2(d), is formed to cover at least the opposite sides of each gate electrode, across the channel, before impurity implantation is performed. Accordingly, the source region S and the drain region D constitute an offset structure with respect to the gate electrode. This offset structure makes it possible to prevent occurrence of a breakdown due to the drain of a thin film transistor TFT.

Figure 9:
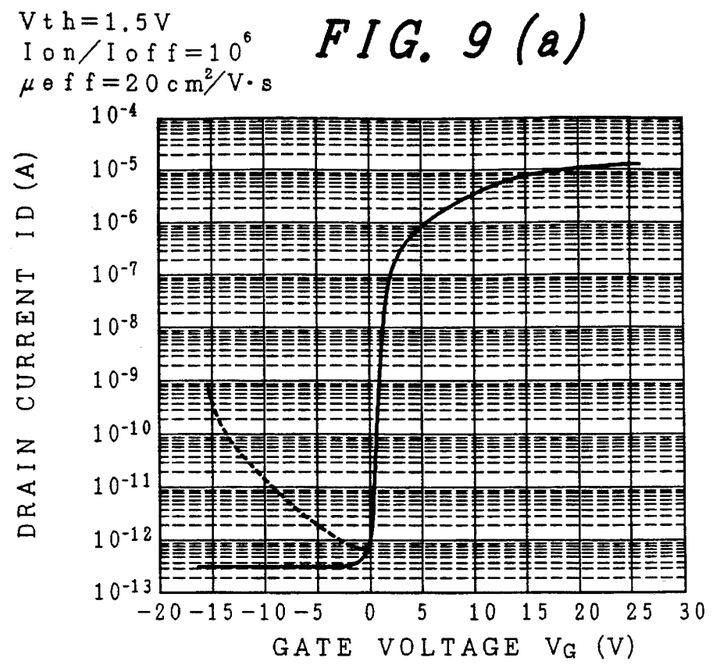
FIGS. 9(a) and 9(b) are explanatory views showing the effects of the method of manufacturing the liquid-crystal display panel according to the present invention.

FIG. 9(a) comparatively shows the characteristic of an n-type thin film transistor element formed by the above-described method and the characteristic of a conventional example. In FIG. 9(a), a dashed line represents the characteristic of the conventional example, while a solid line represents the characteristic of the present embodiment. A channel width W and a channel length CL of the gate electrode of the n-type thin-film transistor device represented by the dashed line are selected to be W/CL=6/5, whereas those of the gate electrode of the n-type thin-film transistor device represented by the solid line are selected to be W/CL=6/5. The amount of offset is 1.5 μm.

As is apparent from FIG. 9(a), substantially no drain current flows if the gate potential is negative.

FIG. 9(b) shows that the present embodiment provides similar effects in forming a p-type thin film transistor TFT. The structure of the p-type thin film transistor represented by a dashed line in FIG. 9(b) is selected to be W/CL=6/6, whereas the structure of the p-type thin film transistor represented by a solid line in FIG. 9(b) is selected to be W/CL=6/6. The amount of offset is 1.5 μm.

As is apparent from the above description, in accordance with the method of manufacturing the liquid-crystal display panel according to the present embodiment, a mask is formed to cover at least the opposite edges (side walls) of a gate electrode, across the channel, before impurity implantation is performed. Accordingly, the source and drain regions formed by this impurity implantation constitute an offset structure with respect to the gate electrode. This offset structure makes it possible to prevent occurrence of a breakdown in the drain of a thin film transistor.

In addition, the aforesaid mask includes a mask for the MOS transistors (different in conductivity type from the thin film transistor) of complementary MOS transistors under process in an area outside a display area, and this mask is used in the same step as a mask for those MOS transistors of the complementary MOS transistors. Accordingly, there is no need to increase the number of manufacturing steps.

Figure 10:
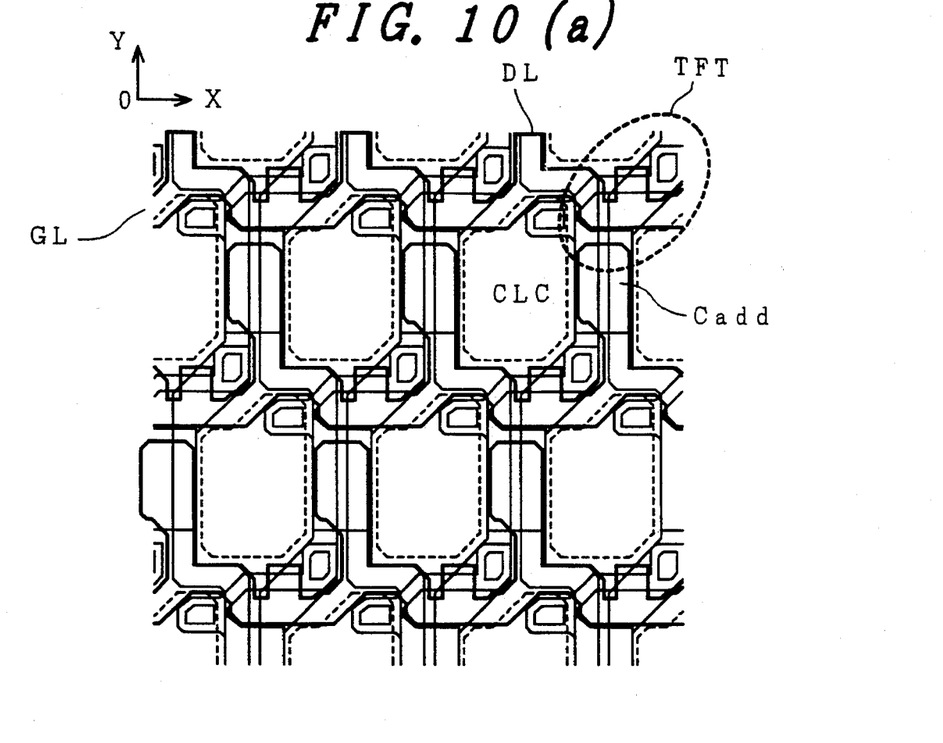
FIGS. 10(a) and 10(b) are explanatory views showing another embodiment of the method of manufacturing the liquid-crystal display panel according to the present invention.

Although the above description has referred to the liquid-crystal display panel which has one thin film transistor for one pixel, as shown in FIG. 8 by way of example, it is of course possible to apply the present invention to a liquid-crystal display panel which has two gate electrodes for the thin film transistor for one pixel, as shown in FIG. 10. Thus, in the embodiment in FIG. 10, having a single thin film transistor for one pixel (each pixel), the thin film transistor has two gate electrodes.

In the embodiment shown in FIG. 10, a storage capacitance element Cadd is connected at one electrode to the pixel electrode CLC and at the other electrode to the gate signal line of an adjacent pixel, so that no capacitance line is needed unlike the embodiment shown in FIG. 8. Therefore, according to the embodiment shown in FIG. 10, it is possible to increase an opening ratio by eliminating capacitance lines, whereby it is possible to achieve advantages such as the simplification of a manufacturing process.

As is apparent from the foregoing description, in accordance with the method of manufacturing the liquid-crystal display panel according to the present invention, it is possible to prevent occurrence of a breakdown in the drains of thin-film transistors formed in a display area, without an increase in the number of manufacturing steps.

While I have shown and described several embodiments in accordance with the present invention, it is understood that the same is not limited thereto, but is susceptible to numerous changes and modifications as known to one having ordinary skill in the art, and I therefore do not wish to be limited to the details shown and described herein, but intend to cover all such modifications as are encompassed by the scope of the appended claims.

What is claimed is:

1. A method of manufacturing a liquid-crystal display panel, comprising the steps of:

forming gate electrodes of MOS transistors corresponding to individual pixels in a display area on a transparent plate, said gate electrodes overlying a channel-forming region of said MOS transistors, and having opposed side walls;

forming gate electrodes of complementary MOS transistors, the complementary MOS transistors including a first group of MOS transistors and a second group of MOS transistors, wherein the gate electrodes of the complementary MOS transistors are formed in an area outside said display area on said transparent plate;

forming a mask for covering a location of said first group of MOS transistors;

forming a mask for covering at least the opposed side walls of the gate electrodes of said MOS transistors in said display area, said mask for covering at least the opposed side walls being formed together with said mask for covering said location of said first group of MOS transistors; and forming source regions and drain regions of said MOS transistors in said display area by impurity ion implantation using said mask for covering at least the opposed side walls of the gate electrodes of said MOS transistors in said display area.

2. A method of manufacturing a liquid-crystal display panel according to claim 1, wherein one group of the first and second groups of said complementary MOS transistors is n-type MOS transistors, and the other group of the first and second groups is p-type MOS transistors.

3. A method of manufacturing a liquid-crystal display panel according to claim 2, wherein source and drain regions of said second group of MOS transistors are formed by impurity ion implantation, together with said forming source regions and drain regions of said MOS transistors in said display area.

4. A method of manufacturing a liquid-crystal display panel according to claim 3, including the further steps of forming a further mask covering a location of said MOS transistors in said display areas and a location of said second group of MOS transistors; and forming source and drain regions of said first group of MOS transistors by ion impurity implantation with said further mask covering said location of said MOS transistors in said display area and said location of said second group of MOS transistors.

5. A method of manufacturing a liquid-crystal display panel according to claim 4, wherein, prior to said forming the further mask, the mask for covering said location of said first group of MOS transistors and the mask for covering at least the opposed side walls of the gate electrodes of said MOS transistors in said display area are removed.

6. A method of manufacturing a liquid-crystal display panel according to claim 5, wherein said mask for covering at least the opposed side walls of the gate electrodes and said mask for covering said location of said first group of MOS transistors are made from a photoresist material, and are formed by forming a photoresist film overlying the transparent plate and selectively removing the photoresist film so as to leave said mask for covering at least the opposed side walls of the gate electrodes and said mask for covering said location of said first group of MOS transistors.

7. A method of manufacturing a liquid-crystal display panel according to claim 1, wherein said mask for covering at least the opposed side walls of the gate electrodes of said MOS transistors in said display area extend away from sides of the gate electrodes, so as to provide source regions and drain regions, by said impurity ion implantation, that are offset from the sides of the gate electrodes.

8. A method of manufacturing a liquid-crystal display panel according to claim 1, wherein, after said forming source regions and drain regions of said MOS transistors in said display area, said mask for covering at least the opposed side walls of the gate electrodes is removed.

9. A method of manufacturing a liquid-crystal display panel according to claim 1, wherein said mask for covering at least the opposed side walls of the gate electrodes and said mask for covering said location of said first group of MOS transistors are made from a photoresist material, and are formed by forming a photoresist film overlying the transparent plate and selectively removing the photoresist film so as to leave said mask for covering at least the opposed side walls of the gate electrodes and said mask for covering said location of said first group of MOS transistors.

10. A method of manufacturing a liquid-crystal display panel according to claim 1, wherein source and drain regions of said second group of MOS transistors are formed by impurity ion implantation, together with said forming source regions and drain regions of said MOS transistors in said display area.

11. A method of manufacturing a liquid-crystal display panel according to claim 1, wherein the mask for covering at least the opposed side walls of the gate electrodes of the MOS transistors in said display area also covers said gate electrodes of the MOS transistors in said display area.

12. A method of manufacturing a liquid-crystal display panel according to claim 1, wherein the number of the gate electrodes of each of said MOS transistors in said display area is two.

13. A method of manufacturing a liquid-crystal display panel according to claim 1, wherein said gate electrodes are formed overlying a semiconductor layer, the source and drain regions of said MOS transistors in said display area being formed in said semiconductor layer, and wherein said mask for covering the opposed side walls of said gate electrodes of said MOS transistors in said display area extends a distance of at least 1.5 µm away from sides of said gate electrodes formed by said side walls, so as to cover said semiconductor layer.

14. A method of manufacturing a liquid-crystal display panel according to claim 1, wherein the MOS transistors in the display area are of an opposite conductivity type to that of the first group of MOS transistors.

\* \* \* \* \*